United States Patent
Fan et al.

(10) Patent No.: US 9,184,520 B2
(45) Date of Patent: Nov. 10, 2015

(54) ELECTRICAL CONNECTOR

(71) Applicant: Unimicron Technology Corp., Taoyuan (TW)

(72) Inventors: Chih-Peng Fan, Taoyuan County (TW); Yin-Hwa Cheng, Taipei (TW); Ching-Ho Hsieh, Taoyuan County (TW); Ling-Kai Su, Taoyuan County (TW); Yung-Hao Hsueh, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 14/253,885

(22) Filed: Apr. 16, 2014

(65) Prior Publication Data

US 2014/0335706 A1   Nov. 13, 2014

Related U.S. Application Data

(63) Continuation-in-part of application No. 13/934,238, filed on Jul. 3, 2013, now abandoned.

(30) Foreign Application Priority Data

May 8, 2013  (TW) .............................. 102116353 A (51) Int. Cl.
| | | |
|---|---|---|
| *H01R 12/00* | (2006.01) | |
| *H01R 12/71* | (2011.01) | |
| *H05K 3/32* | (2006.01) | |
| *H05K 3/40* | (2006.01) | |

(52) U.S. Cl.
CPC .............. *H01R 12/718* (2013.01); *H05K 3/326* (2013.01); *H05K 3/4092* (2013.01);*H01L 2924/15311* (2013.01); *H01L 2924/15313* (2013.01); *H05K 2201/0367* (2013.01);

(Continued)

(58) Field of Classification Search
CPC ...... H01R 12/718; H05K 3/4092; H05K 3/326
USPC .................................................. 439/82, 66, 81
See application file for complete search history.

(56) References Cited

U.S. PATENT DOCUMENTS 5,172,050 A * 12/1992 Swapp ..................... 324/750.03
5,615,824 A *  4/1997 Fjelstad et al. ............. 228/180.1

(Continued)

FOREIGN PATENT DOCUMENTS

| TW | I298237 | 6/2008 |
|---|---|---|
| TW | 201306403 | 2/2013 |

OTHER PUBLICATIONS

"Office Action of U.S. Parent Application, U.S. Appl. No. 13/934,238" issued on Sep. 12, 2014, p. 1-p. 9.

*Primary Examiner* — Neil Abrams
*Assistant Examiner* — Travis Chambers
(74) *Attorney, Agent, or Firm* — Jianq Chyun IP Office (57) ABSTRACT

An electrical connector includes a base and an elastic terminal. The base has a recess. The elastic terminal is connected to the base and extends to the recess. The elastic terminal has a fixed end and a free end, the fixed end is connected to the base, and the free end is located at the recess and is curved. When the contact moves towards the recess, the contact is capable of pushing the contact protrusion to bend towards the bottom of the recess so that the free end leans against the bottom of the recess. The electrical connector may further include a contact protrusion connected to the elastic terminal. When the contact moves towards the recess, the contact is capable of pushing the contact protrusion to make the elastic terminal bend towards the bottom portion of the recess so that the free end leans against the bottom of the recess.

14 Claims, 10 Drawing Sheets (52) U.S. Cl.
CPC ............... *H05K 2201/0397* (2013.01); *H05K 2201/09036* (2013.01); *H05K 2201/10265* (2013.01); *H05K 2201/10719* (2013.01)

(56) References Cited

U.S. PATENT DOCUMENTS

| | | | | |
|---|---|---|---|---|
| 6,037,786 | A | * | 3/2000 | Palagonia ................ 324/754.18 |
| 6,437,591 | B1 | * | 8/2002 | Farnworth et al. ........ 324/756.02 |
| 6,482,013 | B2 | * | 11/2002 | Eldridge et al. ................. 439/66 |
| 6,517,362 | B2 | * | 2/2003 | Hirai et al. ........................ 439/82 |
| 6,986,669 | B2 | | 1/2006 | Kawai |
| 7,189,077 | B1 | | 3/2007 | Eldridge et al. |
| 7,317,322 | B2 | * | 1/2008 | Farnworth et al. ........ 324/754.08 |
| 7,322,829 | B2 | * | 1/2008 | Ma ................................. 439/66 |
| 2009/0197437 | A1 | * | 8/2009 | Ouchi et al. .................... 439/68 |

* cited by examiner

ELECTRICAL CONNECTOR

CROSS-REFERENCE TO RELATED APPLICATION

This application a continuation-in-part of and the priority benefit of U.S. application Ser. No. 13/934,238, filed on Jul. 3, 2013. The prior application Ser. No. 13/934,238 claims the priority benefit of Taiwan application serial no. 102116353, filed on May 8, 2013. The entirety of each of the above-mentioned patent applications is hereby incorporated by reference herein and made a part of this specification.

BACKGROUND OF THE INVENTION

1. Field of the Invention

The invention generally relates to an electrical connector, and more particularly, to an electrical connector suitable for contacting contacts (such as flat contacts or the bump contacts).

2. Description of Related Art

Usually, an electrical connector is used for electrical connection between two electronic apparatuses for transmitting signals or supplying power. In the technical field of semiconductor chip packaging, a so-called land grid array (LGA) is a type of high-density contacts used in a circuit carrier, where a plurality of flat contact arrays are arranged on the bottom-surface of the circuit carrier, and the flat contacts can be electrically connected to each other via the internal circuit in the circuit carrier and the integrated circuit (IC) chip mounted on the top surface of the circuit carrier.

In order to mount an LGA-type circuit carrier to a circuit board, in the prior art, a plurality of upward-bent elastic terminals are disposed on a base so as to respectively contact a plurality of flat pads of the circuit carrier in downward moving to realize the electrical connection between the circuit carrier and the electrical connectors. To ensure the contact between the elastic terminals and the flat contacts, the elastic terminal must have a shape required by producing a certain elastic force and the end of the elastic terminal must have an arc shape for contacting the flat pad, and thus, the elastic terminal must be bent upwards by using a machining process.

SUMMARY OF THE INVENTION

Accordingly, the invention is directed to an electrical connector used to electrically contact a contact.

The invention provides an electrical connector suitable for contacting a contact and the electrical connector includes a base, an elastic terminal and a contact protrusion. The base has a recess. The elastic terminal is connected to the base and extends to the recess. The elastic terminal has a fixed end and a free end, the fixed end is connected to the base, and the free end is located at the recess and is curved. The contact protrusion is connected to the elastic terminal, in which when the contact moves towards the recess, the contact is capable of pushing the contact protrusion to make the elastic terminal bend towards the bottom portion of the recess so that the free end leans against the bottom of the recess.

The invention provides an electrical connector suitable for contacting a contact and the electrical connector includes a base and an elastic terminal. The base has a recess. The elastic terminal is connected to the base and extends to the recess. The elastic terminal has a fixed end and a free end, the fixed end is connected to the base, and the free end is located at the recess and is curved. When the contact moves towards the recess, the contact is capable of pushing the contact protrusion to bend towards the bottom portion of the recess so that the free end leans against the bottom of the recess.

Based on the depiction above, in the electrical connector of the invention, the recess is formed on the base and the elastic terminal may extend to the recess. Therefore, when the elastic terminal is pushed by the contact (for example, a bump contact), the elastic terminal is capable of bending towards the bottom of the recess, so that the elastic force produced by the elastic terminal after deformation can ensure the contacting between the elastic terminal and the corresponding contact. In addition, the electrical connector may further have a contact protrusion, which is disposed on the elastic terminal for contacting the contact (such as a flat contact or a bump contact). Moreover, the free end of the elastic terminal may be curved and have elasticity to increase the lifetime of the elastic terminal.

Other objectives, features and advantages of the present invention will be further understood from the further technological features disclosed by the embodiments of the present invention wherein there are shown and described preferred embodiments of this invention, simply by way of illustration of modes best suited to carry out the invention.

DESCRIPTION OF THE EMBODIMENTS

Figure 1:
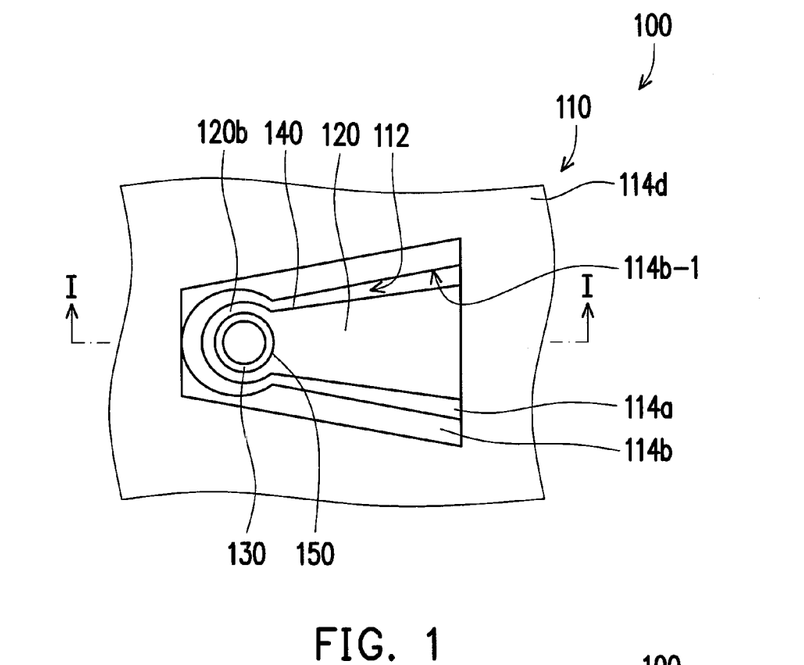
FIG. 1 is a partial top view of an electrical connector according to an embodiment of the invention.
Figure 2:
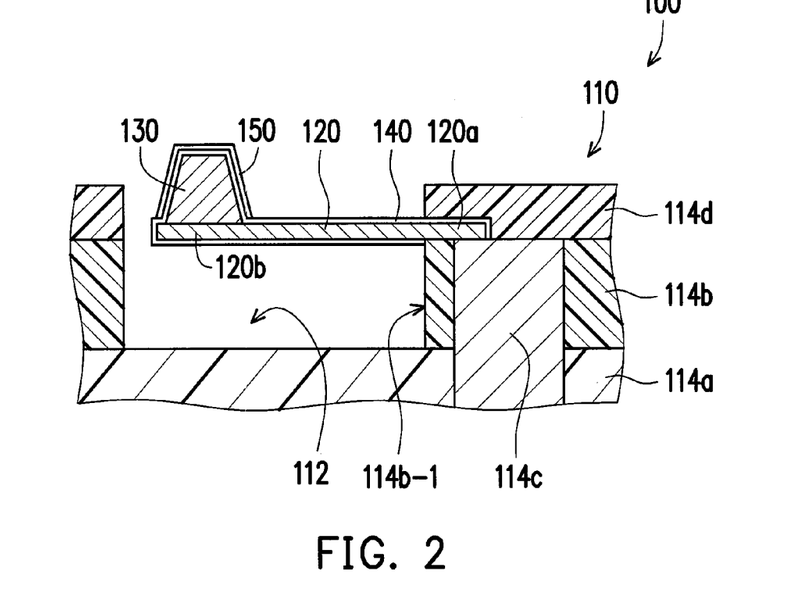
FIG. 2 is a cross-sectional view of the multiple electrical connectors taken along line I-I in FIG. 1.

FIG. 1 is a partial top view of an electrical connector according to an embodiment of the invention, and FIG. 2 is a cross-sectional view of the multiple electrical connectors taken along line I-I in FIG. 1. Referring to FIGS. 1 and 2, an electrical connector 100 of the embodiment is suitable for contacting one or multiple flat contacts (i.e., the flat contacts 52 of the circuit carrier 50 in FIG. 3A). The electrical connector 100 includes a base 110, one or multiple elastic terminals 120 and one or multiple contact protrusions 130. The base 110 has one or multiple recesses 112. Each of the elastic terminals 120 is connected to the base 110 and extends to a corresponding recess 112. Each of the elastic terminals 120 has elasticity and electrical conductivity. Each of the contact protrusions 130 is disposed on the corresponding elastic terminal 120. In the embodiment, each of the elastic terminals 120 may horizontally extend to the corresponding recess 112.

Figure 3A:
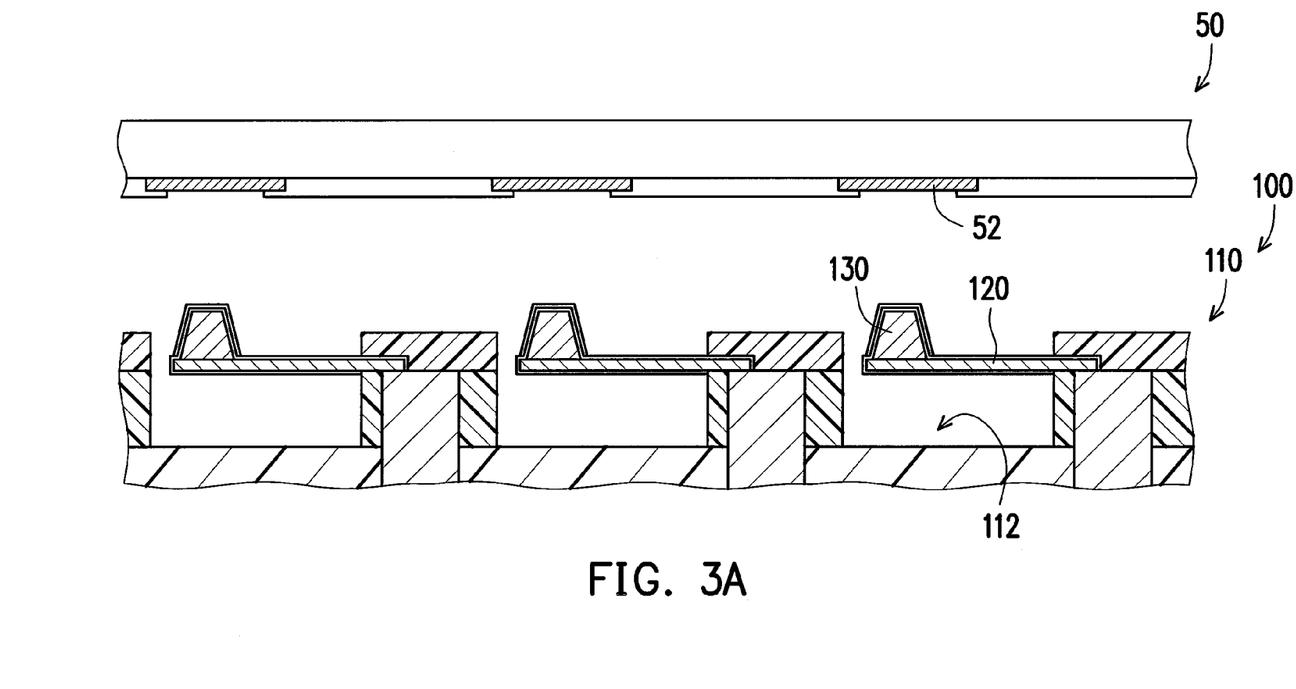
FIG. 3A is a cross-sectional view of the electrical connectors as shown in FIG. 2 prior to contacting the flat contacts.
Figure 3B:
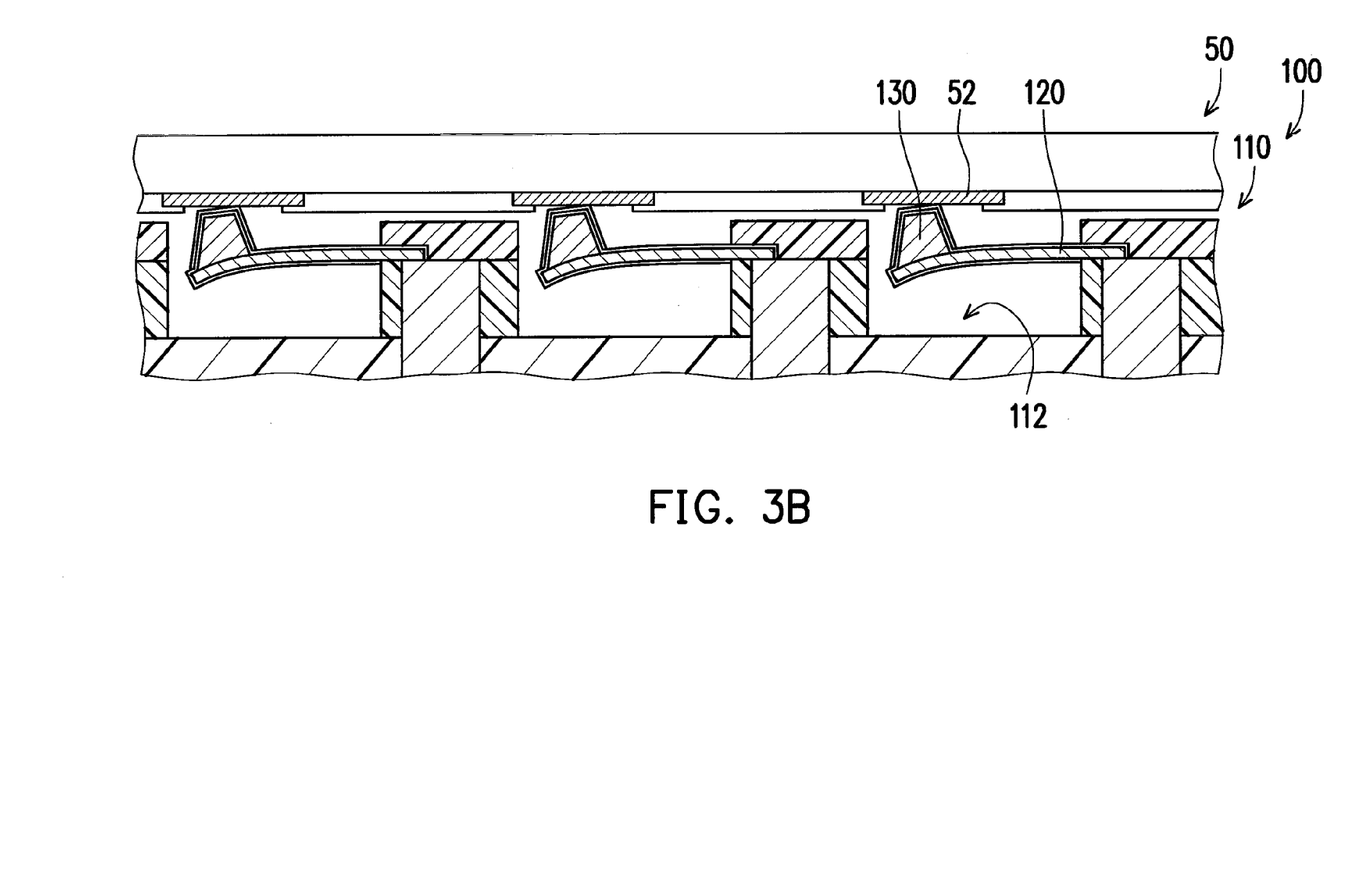
FIG. 3B is a cross-sectional view of the electrical connectors as shown in FIG. 2 after contacting the flat contacts.

FIG. 3A is a cross-sectional view of the electrical connectors as shown in FIG. 2 prior to contacting the flat contacts, and FIG. 3B is a cross-sectional view of the electrical connectors as shown in FIG. 2 after contacting the flat contacts. Referring to FIGS. 3A and 3B, when the flat contacts 52 of the circuit carrier 50 move towards the recesses 112, the flat contacts 52 can respectively push the contact protrusions 130 to make each of the elastic terminals 120 bend towards the bottom of the corresponding recess 112. As a result, the elastic force produced by the elastic terminal 120 after deformation can ensure the contact between the elastic terminal 120 and the corresponding flat contact 52.

Back to FIGS. 1 and 2, in the embodiment, the base 110 may be a printed circuit board (PCB) and the material of the elastic terminals 120 may include copper. In more detail, the base 110 and the elastic terminals 120 may be fabricated through the conventional process for fabricating the PCB. Thus, the base 110 may include a core layer 114a, a dielectric layer 114b, one or multiple conductive pillars 114c and a cover layer 114d, in which an opening 114b-1 of the dielectric layer 114b and the core layer 114a together form the recess 112. The elastic terminals 120 are formed by using an etching process and an etching mask to pattern a copper layer (not shown) disposed on the dielectric layer 114b, or by punching a metallic foil, followed by laminating the metallic foils onto the dielectric layer 114b. Therefore, the thickness of the elastic terminals 120 may be smaller until 0.05 mm with a range between 0.01 mm and 0.2 mm. The thickness and the length of an elastic terminal 120 may be adjusted according to the required elastic force and the contacting area.

A fixed end 120a of the elastic terminal 120 is connected to the base 110, and the conductive pillar 114c is connected to the fixed end 120a of the elastic terminal 120. The cover layer 114d covers the dielectric layer 114b and the fixed ends 120a of the elastic terminals 120. The elastic terminal 120 further has a free end 120b located at the recess 112, while the contact protrusion 130 is located at the free end 120b. The contact protrusion 130 is higher than the cover layer 114d relatively to the recess 112. It should be noted that the invention does not limit the process for fabricating the base 110 and the elastic terminals 120 to the above-mentioned PCB fabrication process. In fact, other processes may be used to fabricate the base 110 and the elastic terminals 120.

Referring to FIGS. 1 and 2 again, in the embodiment, the electrical connector 100 further has a conductive layer 140 (for example, a nickel layer) disposed on the elastic terminals 120 and the corresponding contact protrusions 130. When the flat contacts 52 and the contact protrusions 130 contact each other as shown in FIG. 3A or 3B, the flat contacts 52 are electrically connected to the elastic terminals 120 through the conductive layer 140 on the contact protrusions 130. The contact protrusions 130 may be made of elastic material to have elasticity so as to ensure a good contact between the flat contacts 52 and the contact protrusions 130. In addition, a protection layer 150 (for example, a gold layer) may be disposed on the conductive layer 140, and the protection layer 150 is located at the contact protrusions 130 and at the area where the contact protrusions 130 contact the flat contacts 52 to increase the durability. In another embodiment, when the material of the contact protrusions 130 is conductive so that the flat contacts 52 in FIG. 3A or 3B may be electrically connected to the elastic terminals 120, the conductive layer 140 may be saved.

The above-mentioned embodiment is applied for contacting between the elastic terminals and the flat contacts, but the idea in the embodiment may be also applied for contacting between the elastic terminals and the bump contacts referring to the other embodiment in the following.

Figure 4:
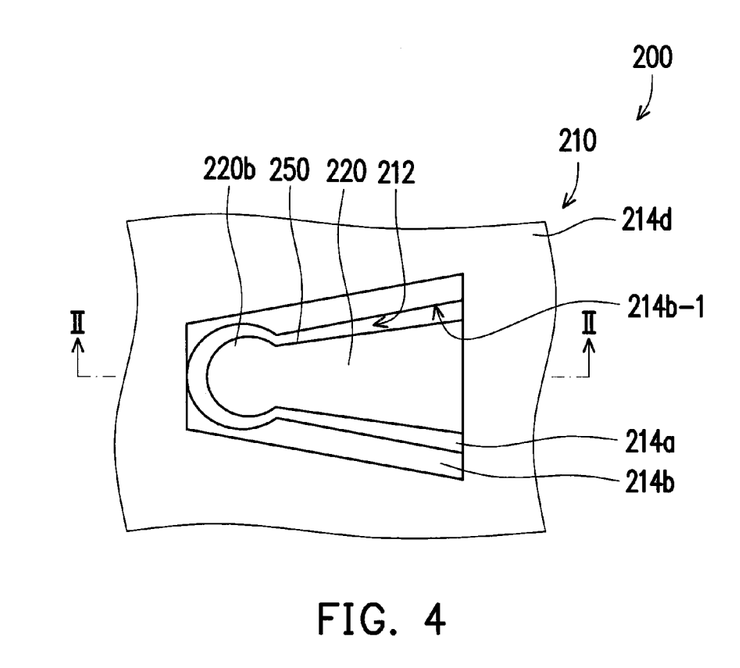
FIG. 4 is a partial top view of an electrical connector according to another embodiment of the invention.
Figure 5:
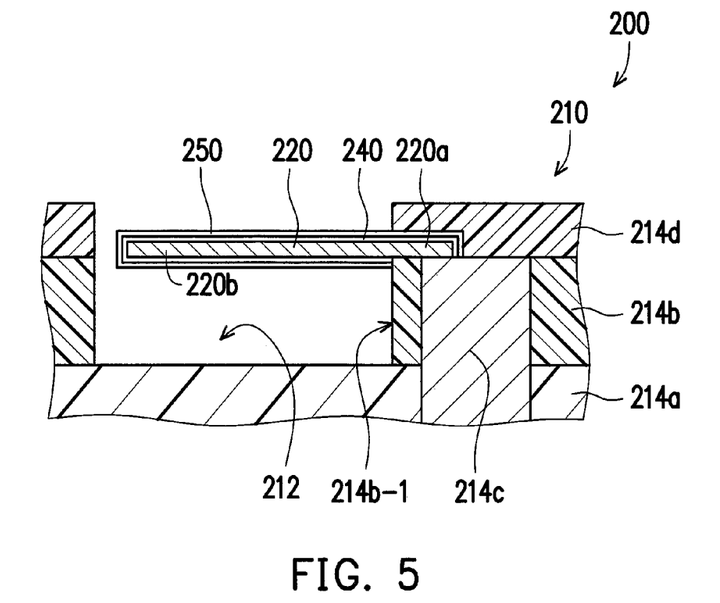
FIG. 5 is a cross-sectional view of the multiple electrical connectors taken along line II-II in FIG. 4.

FIG. 4 is a partial top view of an electrical connector according to another embodiment of the invention, and FIG. 5 is a cross-sectional view of the multiple electrical connectors taken along line II-II in FIG. 4. Referring to FIGS. 4 and 5, an electrical connector 200 of the embodiment is suitable for contacting one or multiple bump contacts (i.e., the bump contacts 62 of the circuit carrier 60 in FIG. 6A). The shape of the bump contacts herein is, for example, spherical shape, cylindrical shape or conical shape. The electrical connector 200 includes a base 210 and one or multiple elastic terminals 220. The base 210 has one or multiple recesses 212. Each of the elastic terminals 220 is connected to the base 210 and extends to a corresponding recess 212. Each of the elastic terminals 220 has elasticity and electrical conductivity. In the embodiment, each of the elastic terminals 220 may horizontally extend to the corresponding recess 212.

Figure 6A:
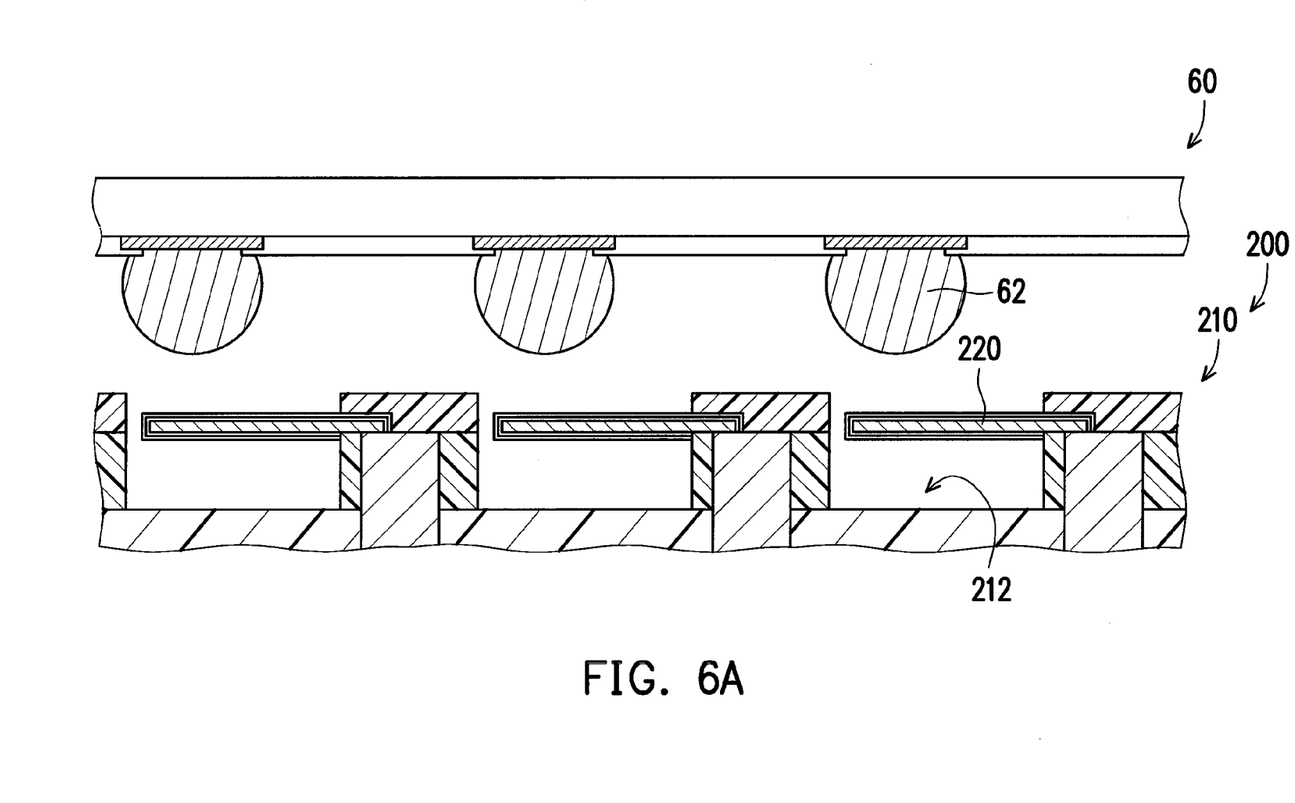
FIG. 6A is a cross-sectional view of the electrical connectors as shown in FIG. 2 prior to contacting the bump contacts.
Figure 6B:
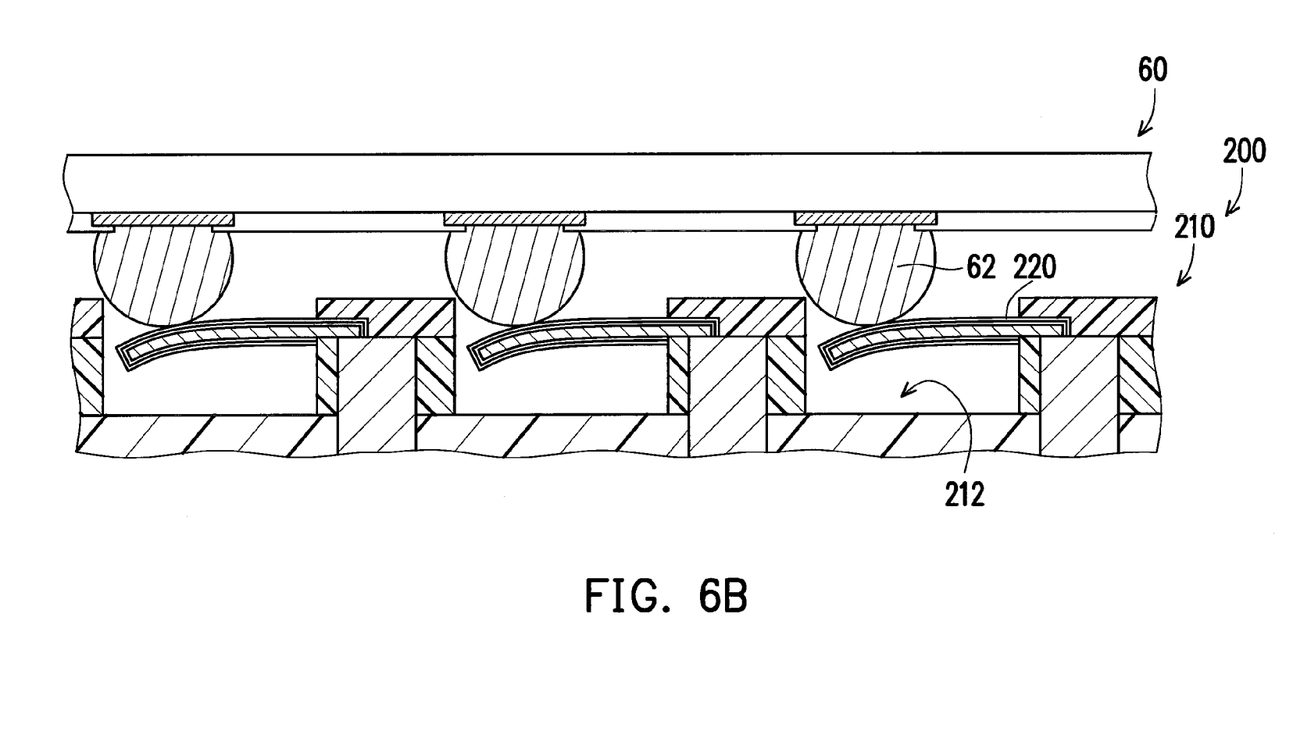
FIG. 6B is a cross-sectional view of the electrical connectors as shown in FIG. 2 after contacting the bump contacts.

FIG. 6A is a cross-sectional view of the electrical connectors as shown in FIG. 2 prior to contacting the bump contacts, and FIG. 6B is a cross-sectional view of the electrical connectors as shown in FIG. 2 after contacting the bump contacts. Referring to FIGS. 6A and 6B, when the bump contacts 62 of the circuit carrier 60 move towards the recesses 212, the bump contacts 62 can respectively push the elastic terminals 220 to make each of the elastic terminals 220 bend towards the bottom of the corresponding recess 212. As a result, the elastic force produced by the elastic terminal 220 after deformation can ensure the contacting between the elastic terminal 220 and the corresponding bump contact 62.

Referring to FIGS. 4 and 5, in the embodiment, the base 210 may be a printed circuit board (PCB) and the material of the elastic terminals 220 may include copper. In more detail, the base 210 and the elastic terminals 220 may be fabricated through the conventional process for fabricating the PCB. Thus, the base 210 may include a core layer 214a, a dielectric layer 214b, one or multiple conductive pillars 214c and a cover layer 214d, in which an opening 214b-1 of the dielectric layer 214b and the core layer 214a together form the recess 212. The elastic terminals 220 are formed by using an etching process and an etching mask to pattern a copper layer (not shown) disposed on the dielectric layer 214b, or by punching the metallic foil, followed by laminating the metallic foils onto the dielectric layer 214b. Therefore, the thickness of the elastic terminals 220 may be smaller until 0.05 mm with a range between 0.01 mm and 0.2 mm. The thickness and the length of an elastic terminal 220 may be adjusted according to the required elastic force and the contacting area.

A fixed end 220a of the elastic terminal 220 is connected to the base 210, and the conductive pillar 214c is connected to the fixed end 220a of the elastic terminal 220. The cover layer 214d covers the dielectric layer 214b and the fixed ends 220a of the elastic terminals 220. The elastic terminal 220 further has a free end 220b located at the recess 212. In addition, the electrical connector 200 in the embodiment further has a conductive layer 240 (for example, a nickel layer) and a protection layer 250 (for example, a gold layer) disposed on the elastic terminals 220 to increase the durability. The conductive layer 240 is helpful for the protection layer 250 to be adhered onto the elastic terminals 220. In another embodiment (not shown), it may be to dispose the protection layer 250 only and the conductive layer 240 is saved. It should be noted that the invention does not limit the process for fabricating the base 210 and the elastic terminals 220 to the above-mentioned PCB fabrication process. In fact, other processes may be used to fabricate the base 210 and the elastic terminals 220.

Figure 7A:
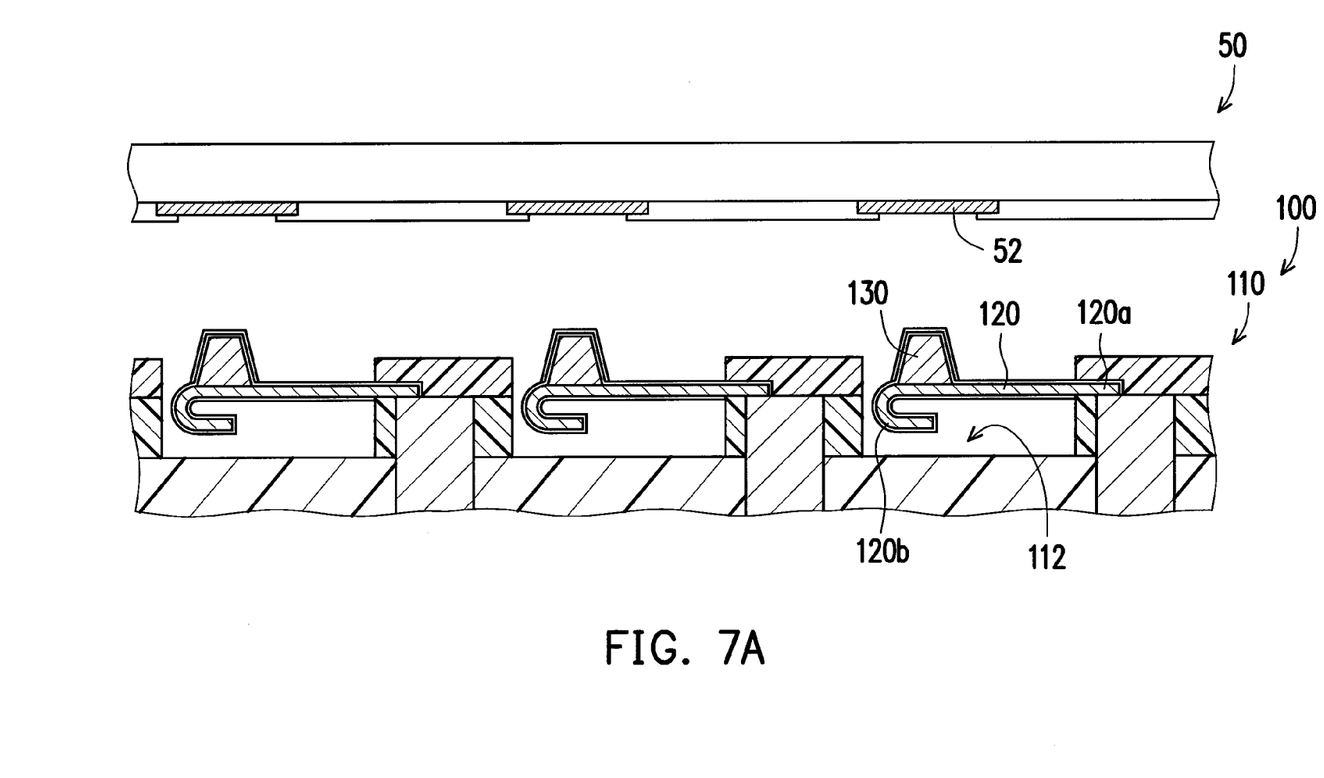
FIG. 7A is a cross-sectional view of an electrical connector prior to contacting the bump contacts according to another embodiment of the invention.
Figure 7B:
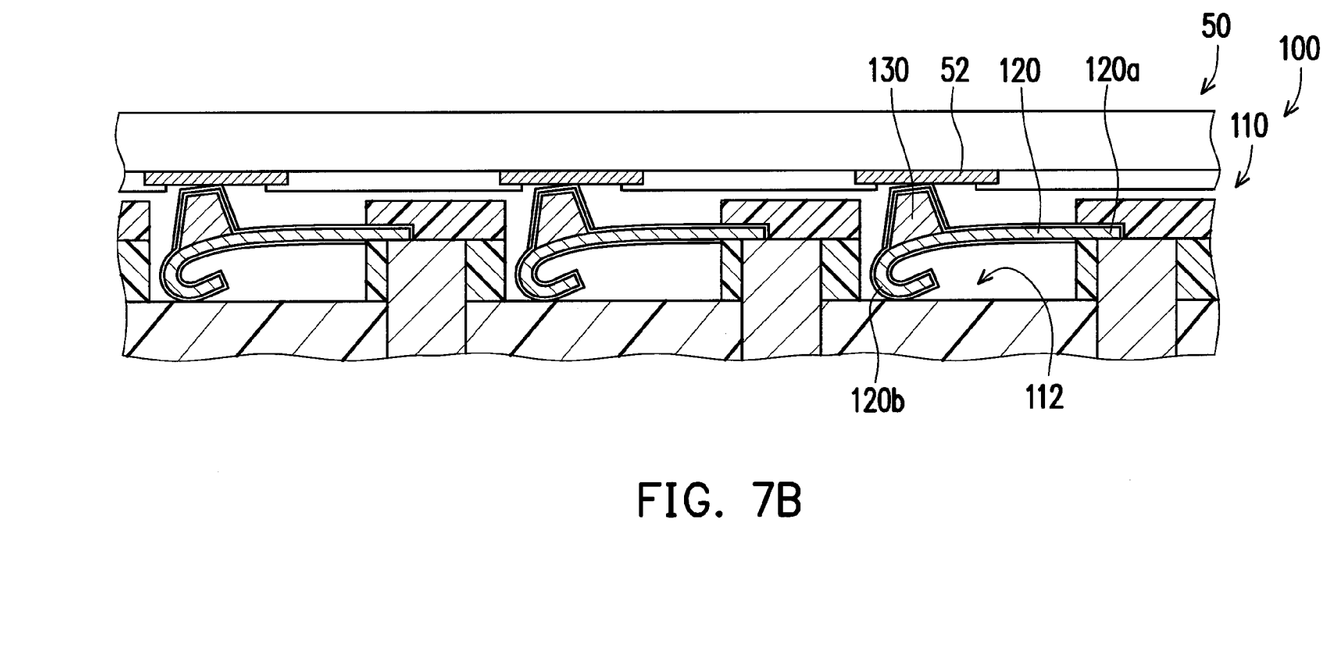
FIG. 7B is a cross-sectional view of the electrical connectors as shown in FIG. 7A after contacting the bump contacts.

FIG. 7A is a cross-sectional view of an electrical connector prior to contacting the bump contacts according to another embodiment of the invention, and FIG. 7B is a cross-sectional view of the electrical connectors as shown in FIG. 7A after contacting the bump contacts. Referring to FIGS. 7A and 7B, in comparison to the embodiments of FIGS. 3A and 3B, the free end 120b of the elastic terminal 120 of the embodiment is further curved, and is, for example, U-shaped, V-shaped, or other shapes having elasticity. Therefore, when the flat contacts 52 move towards the recess 112, the flat contacts 52 can push the elastic terminal 120 to bend towards the bottom of the recess 112 so that the free end 120b leans against the bottom of the recess 112, as shown in FIG. 7B. In the embodiment, the curved free end 120b itself may have elasticity, and therefore the lifetime of the elastic terminal. 120 may be increased.

Figure 8A:
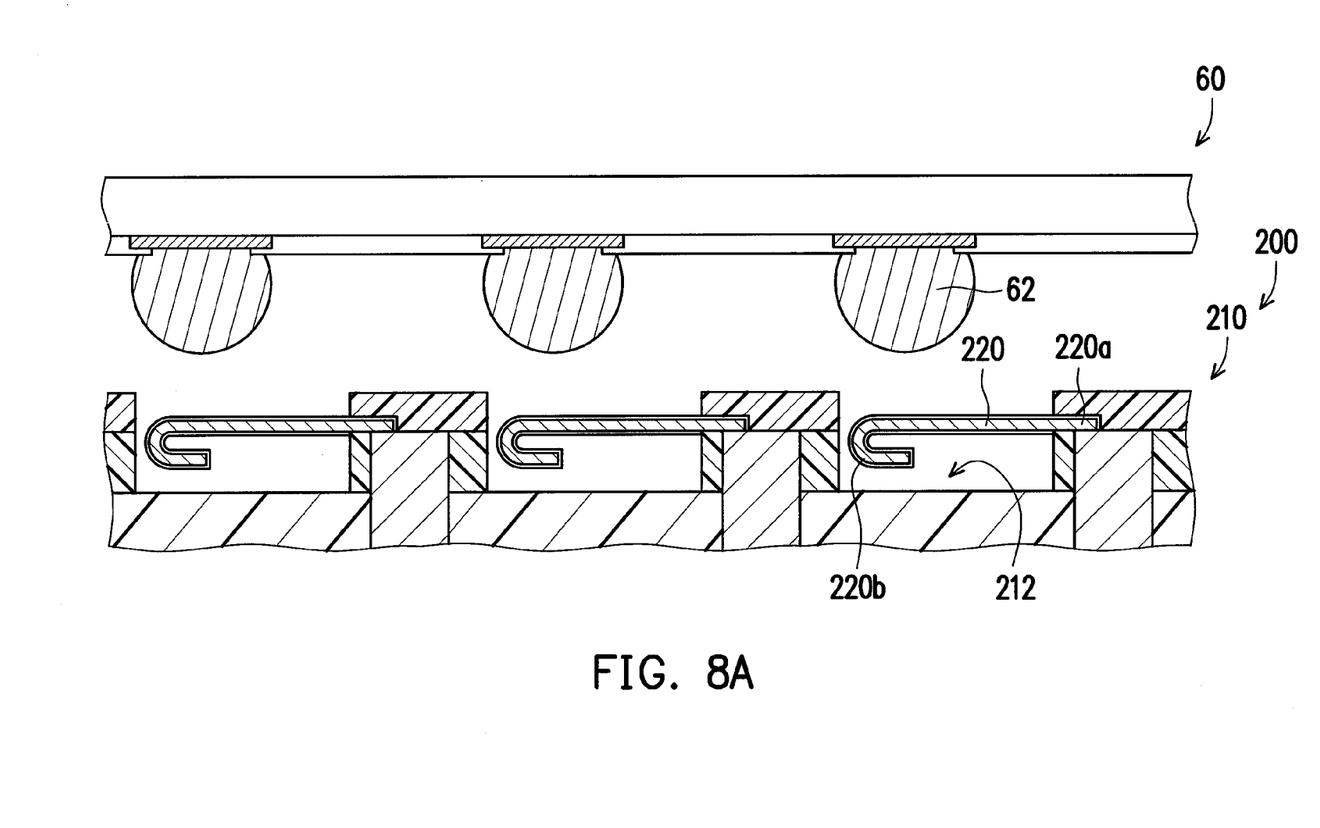
FIG. 8A is a cross-sectional view of an electrical connector prior to contacting the bump contacts according to another embodiment of the invention.
Figure 8B:
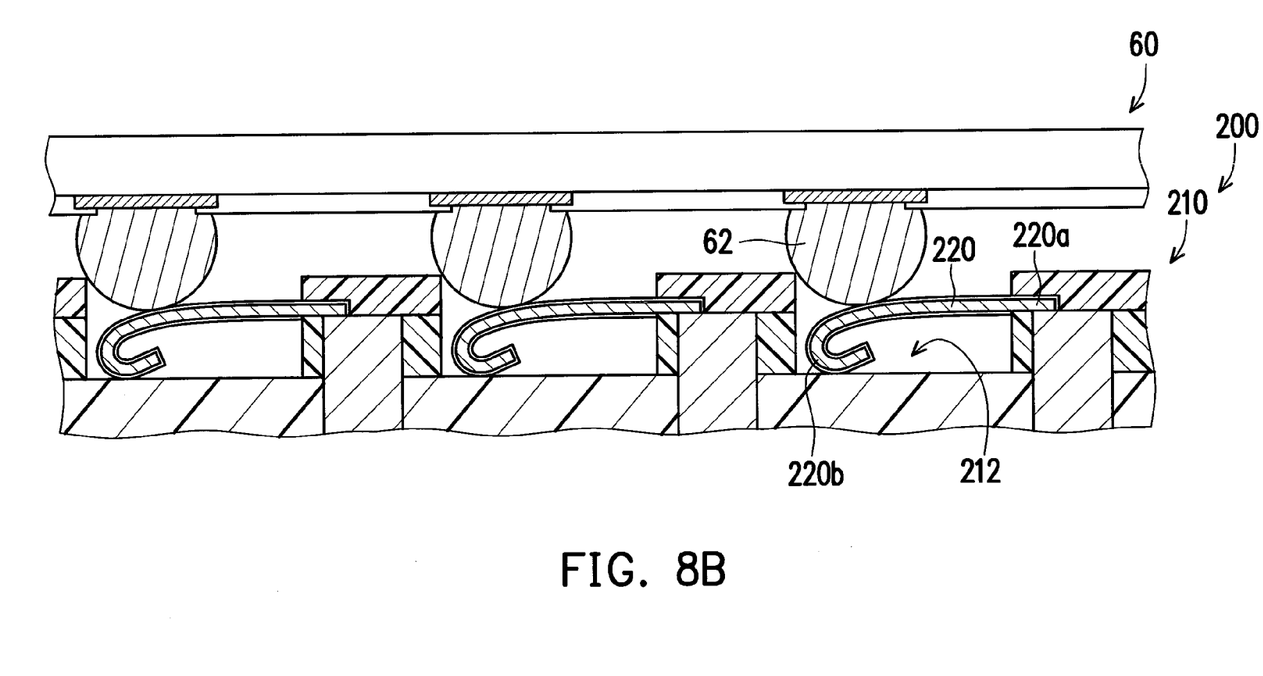
FIG. 8B is a cross-sectional view of the electrical connectors as shown in FIG. 8A after contacting the bump contacts.

FIG. 8A is a cross-sectional view of an electrical connector prior to contacting the bump contacts according to another embodiment of the invention, and FIG. 8B is a cross-sectional view of the electrical connectors as shown in FIG. 8A after contacting the bump contacts. Referring to FIGS. 8A and 8B, in comparison to the embodiments of FIGS. 6A and 6B, the free end 220b of the elastic terminal 220 of the embodiment is further curved, and is, for example, U-shaped, V-shaped, or other shapes having elasticity. Therefore, when the bump contacts 62 move towards the recess 212, the bump contacts 62 can push the elastic terminal 220 to bend towards the bottom of the recess 212 so that the free end 220b leans against the bottom of the recess 212, as shown in FIG. 8B. In the embodiment, the curved free end 220b itself may have elasticity, and therefore the lifetime of the elastic terminal 220 may be increased.

In summary, in the electrical connector of the invention, the recess is formed on the base and the elastic terminal may extend to the recess. Therefore, when the elastic terminal is pushed by the contact (for example, a bump contact), the elastic terminal is capable of bending towards the bottom of the recess, so that the elastic force produced by the elastic terminal after deformation can ensure the contacting between the elastic terminal and the corresponding contact. In addition, the electrical connector may further have a contact protrusion, which is disposed on the elastic terminal for contacting the contact (such as a flat contact or a bump contact). Moreover, the free end of the elastic terminal may be curved and have elasticity to increase the lifetime of the elastic terminal.

It will be apparent to those skilled in the art that the descriptions above are several preferred embodiments of the invention only, which does not limit the implementing range of the invention. Various modifications and variations can be made to the structure of the invention without departing from the scope or spirit of the invention. The claim scope of the invention is defined by the claims hereinafter.

What is claimed is:

1. An electrical connector, suitable for contacting a contact and comprising:
    a base, having a recess;
    an elastic terminal, connected to the base and extending to the recess, wherein the elastic terminal has a fixed end and a free end, the fixed end is connected to the base, and the free end is located at the recess and is curved; and
    a contact protrusion, connected to the elastic terminal and located at the free end, wherein when the contact moves towards the recess, the contact is capable of pushing the elastic terminal to bend towards a bottom surface of the recess so that the free end leans against the bottom surface of the recess.

2. The electrical connector as claimed in claim 1, wherein the free end is U-shaped or V-shaped.

3. The electrical connector as claimed in claim 1, wherein the base further comprises a cover layer, the contact protrusion is higher than the cover layer relatively to the recess, the contact is a flat contact, and when the flat contact moves towards the recess, the flat contact is capable of pushing the contact protrusion to make the elastic terminal bend towards the bottom of the recess.

4. The electrical connector as claimed in claim 1, wherein the base further comprises a cover layer, the contact protrusion is lower than the cover layer relatively to the recess, the contact is a bump contact, and when the bump contact moves towards the recess, the bump contact is capable of pushing the contact protrusion to make the elastic terminal bend towards the bottom of the recess.

5. The electrical connector as claimed in claim 1, wherein the base is a printed circuit board (PCB), and material of the elastic terminal includes copper.

6. The electrical connector as claimed in claim 1, wherein the contact protrusion has electrical conductivity.

7. The electrical connector as claimed in claim 1, further comprising:
    a conductive layer, disposed on the elastic terminal and the contact protrusion.

8. The electrical connector as claimed in claim 7, further comprising:
    a protection layer, disposed on the conductive layer and located at the contact protrusion and at an area where the contact protrusion contacts the flat contact.

9. The electrical connector as claimed in claim 7, wherein the contact protrusion has elasticity.

10. An electrical connector, suitable for contacting a contact and comprising:
    a base, having a recess; and
    an elastic terminal, connected to the base and extending to the recess, wherein the elastic terminal has a fixed end and a free end, the fixed end is connected to the base, and the free end is located at the recess and is curved, and when the contact moves towards the recess, the contact is capable of pushing the elastic terminal to bend towards a bottom surface of the recess so that the free end leans against the bottom surface of the recess.

11. The electrical connector as claimed in claim 10, wherein the free end is U-shaped or V-shaped.

12. The electrical connector as claimed in claim 10, wherein the contact is a bump contact, and when the bump contact moves towards the recess, the bump contact is capable of pushing the elastic terminal to bend towards the bottom of the recess.

13. The electrical connector as claimed in claim 10, wherein the base is a printed circuit board (PCB), and material of the elastic terminal includes copper.

14. The electrical connector as claimed in claim 10, further comprising:
    a protection layer, disposed on the elastic terminal.

* * * * *